(12) United States Patent
Hayama

(10) Patent No.: US 6,940,985 B2
(45) Date of Patent: *Sep. 6, 2005

(54) SHOCK SOUND PREVENTION CIRCUIT

(75) Inventor: Koichi Hayama, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 274 days.

This patent is subject to a terminal disclaimer.

(21) Appl. No.: 10/421,622

(22) Filed: Apr. 23, 2003

(65) Prior Publication Data
US 2003/0228024 A1 Dec. 11, 2003

(30) Foreign Application Priority Data
Apr. 23, 2002 (JP) ........................................ 2002-120629

(51) Int. Cl.⁷ .............................................. H04B 15/00
(52) U.S. Cl. .......................... 381/94.5; 330/297; 330/51
(58) Field of Search ................................ 381/94.5, 120, 381/121; 330/51, 297, 207 P, 199, 149

(56) References Cited
U.S. PATENT DOCUMENTS 4,433,306 A * 2/1984 Honda et al. ............... 330/297
5,101,170 A * 3/1992 Torazzina et al. ............ 330/51

* cited by examiner

Primary Examiner—Ping Lee
(74) Attorney, Agent, or Firm—Fish & Richardson P.C.

(57) ABSTRACT

A shock sound prevention circuit which makes a BTL audio amplifier operate stable 100 msec after turning-on of a power supply is offered. The shock sound prevention circuit includes a terminal for reference voltage which rises according to turning-on of a power supply, a first operational amplifier to which the reference voltage is applied as a bias voltage and amplifies the audio signal input from an input terminal, a second operational amplifier to which the reference voltage from the terminal for reference voltage is applied as a bias voltage and amplifies a reverse signal of the audio signal applied to the first operational amplifier, a first and a second buffers to which the reference voltage is applied, a first output terminal to which an output of the first operational amplifier and an output of the first buffer are connected together, and a second output terminal to which an output of the second operational amplifier and an output of the second buffer are connected together.

9 Claims, 3 Drawing Sheets

SHOCK SOUND PREVENTION CIRCUIT

BACKGROUND OF THE INVENTION

1. Field of the Invention

This invention relates to a shock sound prevention circuit used in a BTL (Balanced Transformer-less) audio amplifier, specifically to a shock sound prevention circuit for an audio amplifier using two operational amplifiers which can be biased with a single reference voltage.

2. Description of the Related Art

Some of electronic cameras such as video camcorders and digital still cameras are equipped with liquid crystal display monitors. When equipped with the liquid crystal display monitors, they need audio functions and require speaker functions. For example, a speaker function tells a user with an audio sound that a power is turned on, when the user turns the power on.

Such a sound is called a beep sound, and is generated to last about 100 ms after turning the power on. Many of the electronic cameras use low power supply voltage. Thus, they often use BTL method, which can secure wide dynamic range even at the low power supply voltage. The BTL method provides each of both ends of the speaker with each of a pair of signals having a phase opposite to each other, making it possible to secure the wide dynamic range.

An audio amplifier according to the BTL method is shown in FIG. 2. An audio signal is applied to an input terminal 1, as shown in FIG. 2. A terminal 2 and a terminal 3 are pins of an IC (integrated circuit). A capacitance C2 is an external part of the IC. The capacitance C2 is a blocking capacitor. The audio signal is once outputted from the IC, and then returned into the IC after DC (direct current) component is removed.

The audio signal returned into the IC is amplified by a first operational amplifier 4. A gain of the first operational amplifier 4 is determined according to a feedback ratio determined by a ratio between a resistance R9 and a resistance R10. The audio signal is applied to a negative input terminal (−) of the first operational amplifier 4, thus a reverse audio signal is obtained at an output terminal 5. A capacitance C1 for reference voltage is charged from the IC upon turning-on of a power supply. A reference voltage is generated from a reference voltage generation circuit 6, as the capacitance C1 is charged. The reference voltage is applied as a bias voltage to positive input terminals (+) of the first operational amplifier 4 and a second operational amplifier 7.

The audio signal generated at the output terminal 5 of the first operational amplifier 4 is applied to a negative input terminal of the second operational amplifier 7. Thus, an audio signal with a phase reversed once again is obtained at an output terminal 8. In other words, an audio signal returned to a normal phase is obtained. The second operational amplifier operates similar to the first operational amplifier 4, and its gain is determined by a ratio between a resistance R11 and a resistance R12.

Therefore, a normal audio signal is obtained at the terminal 10 while the reverse audio signal is obtained at the terminal 9. A speaker 11 is driven by the two audio signals to make a sound such as the beep sound.

However, an audio amplifier usually generates a shock sound when the power supply is turned on. On that account, there arises a problem that the shock sound disturbs the beep sound.

With this being the situation, this invention offers a shock sound prevention circuit in the BTL audio amplifier as shown in FIG. 2, which enables a stable operation 100 msec after turning-on of the power supply.

SUMMARY OF THE INVENTION

This invention is directed to solve the problem addressed above, and offers a shock sound prevention circuit including a terminal for reference voltage which rises according to turning-on of a power supply, a first operational amplifier to which an audio signal input and the reference voltage are applied, a second operational amplifier to which a reverse signal of the audio signal input and the reference voltage are applied and a first and a second buffers to which the reference voltage is applied, wherein the first and the second buffers are turned on while the first and the second operational amplifiers are turned off, immediately after turning-on of the power supply.

And a shock sound prevention circuit of this invention includes an input terminal to apply an audio signal from which DC component is removed, a terminal for reference voltage which rises according to turning-on of a power supply, a first operational amplifier to which the reference voltage from the terminal for reference voltage is applied as a bias voltage and amplifies the audio signal input from the input terminal, a second operational amplifier to which the reference voltage from the terminal for reference voltage is applied as a bias voltage and amplifies a reverse signal of the audio signal applied to the first operational amplifier, a first and a second buffers to which the reference voltage from the terminal for reference voltage is applied, a first output terminal to which an output of the first operational amplifier and an output of the first buffer are connected together and a second output terminal to which an output of the second operational amplifier and an output of the second buffer are connected together, wherein the first and the second buffers are turned on while the first and the second operational amplifiers are turned off immediately after turning-on of the power supply, and DC voltages at the first and the second output terminals are varied identically with each other accordingly as the reference voltage varies, so that a shock sound arising from DC change between the first and the second terminals is prevented.

And a shock sound prevention circuit of this invention includes a blocking capacitor to remove DC component in an audio signal input, a capacitance for a reference voltage which is charged upon turning-on of a power supply and generates the reference voltage, a first operational amplifier to which the reference voltage from the capacitance for reference voltage is applied as a bias voltage and amplifies an audio signal from the blocking capacitor, a second operational amplifier to which the reference voltage from the capacitance for reference voltage is applied as a bias voltage and amplifies a reverse signal of the audio signal applied to the first operational amplifier, a first and a second buffers to which the reference voltage from the capacitance for reference voltage is applied, a first output terminal to which an output of the first operational amplifier and an output of the first buffer are connected together, a second output terminal to which an output of the second operational amplifier and an output of the second buffer are connected together and a speaker connected between the first output terminal and the second output terminal, wherein the first and the second buffers are turned on while the first and the second operational amplifiers are turned off immediately after turning-on of the power supply, and DC voltages at the first and the second output terminals are varied identically with each other accordingly as the reference voltage varies, so that a shock sound from the speaker is prevented from occurring.

DETAILED DESCRIPTION OF THE INVENTION

Figure 1:
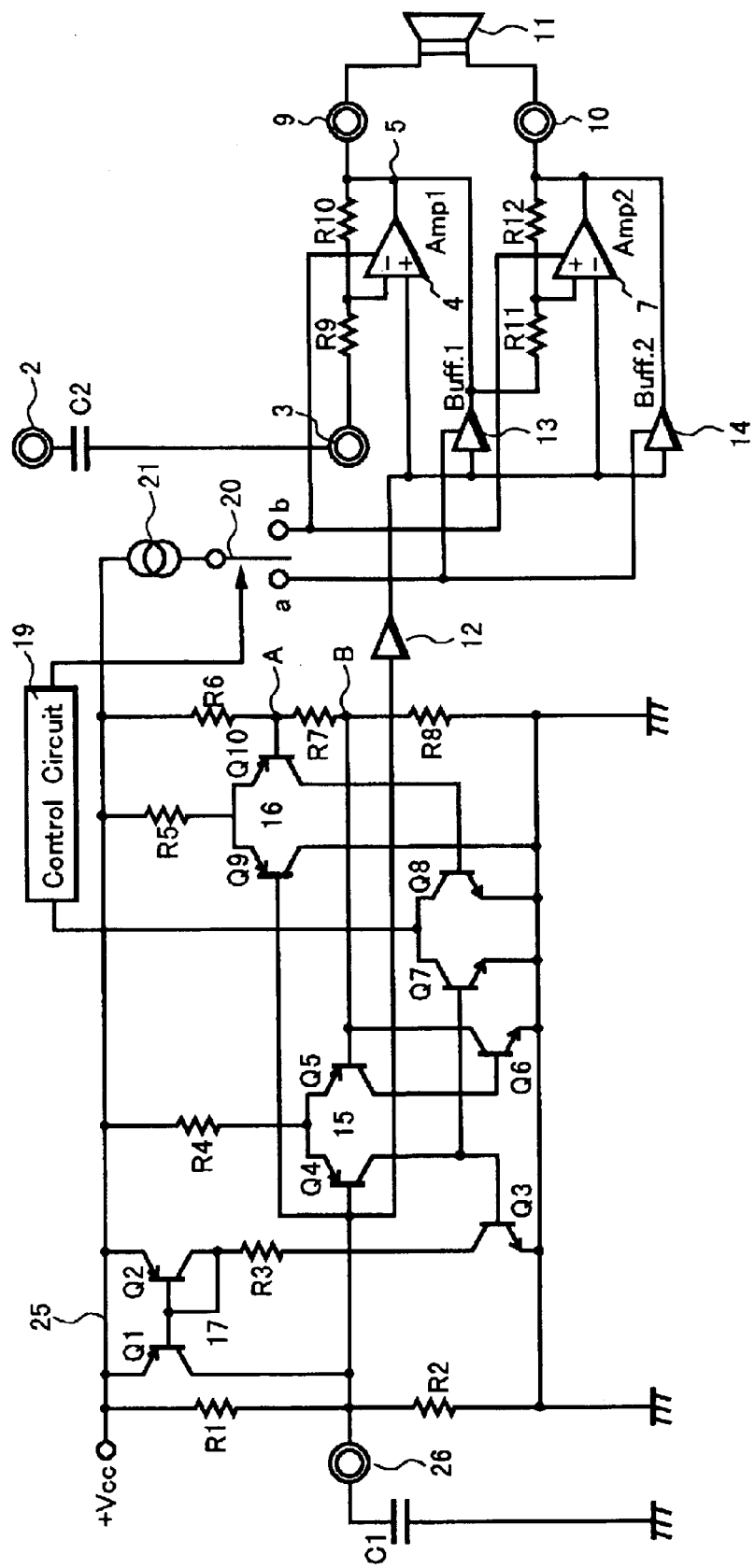
FIG. 1 is a circuit diagram showing a shock sound prevention circuit according to an embodiment of this invention.

Next, an embodiment of this invention will be explained in detail, referring to the figures. As shown in FIG. 1, a reference voltage from a capacitance C1 for reference voltage is inputted to a buffer 12, which outputs a reference voltage of the same voltage as the input voltage. The reference voltage from the buffer 12 is applied as an input voltage to a first buffer 13 and a second buffer 14.

An output of a first operational amplifier 4 and an output of the first buffer 13 are connected together to a terminal 9. An output of a second operational amplifier 7 and an output of the second buffer 14 are connected together to a terminal 10. Resistances R6, R7 and R8 divide a power supply voltage Vcc according to ratios of the resistances to generate reference voltages at a node A and at a node B.

A first level comparator 15 consists of transistors Q4 and Q5 and a resistance R4, compares the reference voltage from the capacitance C1 for reference voltage with the reference voltage at the node B and applies the results to bases of transistors Q3 and Q6. A second level comparator 16 consists of transistors Q9 and Q10 and a resistance R5, compares the reference voltage from the capacitance C1 for reference voltage with the reference voltage at the node A, and applies the result to a base of a transistor Q8.

A current mirror circuit 17 charges the capacitance C1 for reference voltage with a current equal to a collector current of the transistor Q3, which is limited by a resistance R3. A control circuit 19 generates a control signal corresponding to turning-on of a transistor Q7 or a transistor Q8. A switch 20 selects between a terminal a and a terminal b according to a control signal from the control circuit 19. An operating current source 21 provides either of the first operational amplifier 4 and the second operational amplifier 7 or the first buffer 13 and the second buffer 14 with an operating current through the switch 20.

Figure 2:
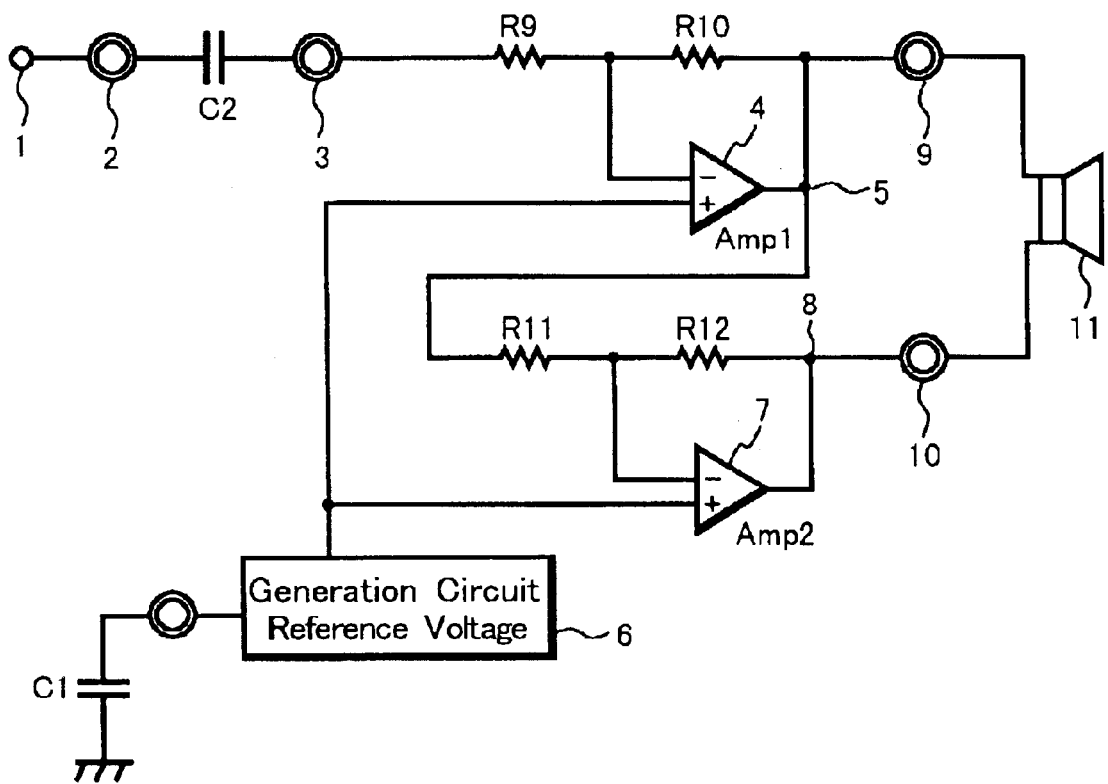
FIG. 2 is a circuit diagram showing a BTL audio amplifier.

Note that a common element is given the same symbol in FIG. 1 as in FIG. 2.

In the circuit shown in FIG. 1, the reference voltage from the buffer 12 is applied not only to the first operational amplifier 4 and the second operational amplifier 7, but also to the first buffer 13 and the second buffer 14.

And the first buffer 13 and the second buffer 14 are enabled while the first operational amplifier 4 and the second operational amplifier 7 are disabled immediately after turning-on of the power supply. Output voltages of the first buffer 13 and the second buffer 14 are exactly the same as an output voltage of the buffer 12.

Hence, exactly the same DC voltages are generated at the terminal 9 and at the terminal 10, thus no current flows through the speaker 11 and no sound is made. Because the output terminals of the first buffer 13 and the second buffer 14 have low impedances, and because both of the first operational amplifier 4 and the second operational amplifier 7 are disabled, they are not affected by the signal from the terminal 3 or noise due to rising power supply voltage.

This status is kept for duration of time that a shock sound occurs, during which the output voltage of the buffer 12 rises to a bias level Vref1 which the first operational amplifier 4 and the second operational amplifier 7 need. Until then, the switch 20 is turned to the terminal a. Meantime, the first buffer 13 and the second buffer 14 charge the blocking capacitor C2 to Vref1 through the resistances R9 and R10.

Because the operation described above makes DC voltages at the terminal 3, at the terminal 9 and at the terminal 10 equal, no current flows through the speaker 11 when the switch 20 turns to the terminal b and the first operational amplifier 4 and the second operational amplifier 7 begin their operation. Since the DC voltages at the terminal 3, at the terminal 9 and at the terminal 10 are equal, an AC (alternating current) audio signal from the terminal 2 is applied to the first operational amplifier 4 through the blocking capacitor C2 and the resistance R9. An output signal of the first operational amplifier 4 is applied to the second operational amplifier 7 through the resistance R11, since the first buffer 13 is disabled.

Therefore, a normal audio signal is obtained at the terminal 10 while the reverse audio signal is obtained at the terminal 9. A speaker 11 is driven by the two audio signals to make a sound such as the beep sound.

Next, how the reference voltage of the buffer 12 rises and how the switch 20 alternates between the terminal a and the terminal b will be explained. Now a voltage at a power supply line 25 in FIG. 1 is assumed to be switched from a ground to Vcc.

Then, reference voltages are immediately generated at the node A and at the node B. The reference voltage at the node A is applied to a base of the transistor Q10 and the reference voltage at the node B is applied to a base of the transistor Q5. Resistances R1 and R2 are set to have high value of resistance of about 50 KΩ.

This is to remove ripples on the power supply line 25. The reference voltage of the capacitance C1 for reference voltage needs to be stable, because it is used as a bias voltage for the operational amplifiers. Consequently, a voltage at a terminal 26 is low at first. Therefore, the transistor Q4 is turned on while the transistor Q5 is turned off. When the transistor Q4 is tuned on, the transistor Q7 is turned on.

A voltage at a base of the transistor Q9 is low because the voltage at the terminal 26 is low. Therefore, the transistor Q9 is turned on while the transistor Q10 is turned off. With the transistor Q7 turned on, the control circuit 19 turns the switch 20 to the terminal a.

As a result, the first buffer 13 and the second buffer 14 are enabled while the first operational amplifier 4 and the second operational amplifier 7 are disabled immediately after turning-on of the power supply.

How long this status should last is determined according to timings of generation of the shock sound and the beep sound. Duration of this status is determined by a charging rate of the capacitance C1 for reference voltage. That is, the status changes when the voltage charged to the capacitance C1 for reference voltage exceeds the reference voltage at the node B. Since the resistance R1 has the high value of resistance, charging only through the resistance R1 takes a long time.

Thus, the charging rate to the capacitance C1 for reference voltage is adjusted by the current mirror circuit 17 in the circuit shown in FIG. 1. The transistor Q3 is turned on at the same time the transistor Q7 is turned on. When the transistor Q3 is turned on, the current mirror circuit 17 is put in operation, and a current equal to a current flowing through the resistance R3 flows into the capacitance C1 for reference voltage. A conversion timing of the first level comparator 15 can be chosen freely, since the current flowing through the current mirror circuit 17 is determined by the resistance R3.

As described above, charging to the capacitance C1 for reference voltage is made through the resistance R1 and the current mirror circuit 17 to raise the voltage at the terminal 26. When the voltage charged to the capacitance C1 for reference voltage exceeds the reference voltage at the node B, the transistor Q4 is turned off and the transistor Q5 is turned on. When the transistor Q5 is turned on, the transistor Q6 is turned on and the reference voltage at the node B is turned to a low level.

This is made to reduce an inversion time of the first level comparator 15. When the transistor Q4 is turned off, the transistors Q3 and Q7 are turned off. When the transistor Q3 is turned off, the charging made through the current mirror circuit 17 comes to a halt. With the transistor Q7 turned off, the control circuit 19 turns the switch 20 to the terminal b.

As a result, the first buffer 13 and the second buffer 14 are disabled while the first operational amplifier 4 and the second operational amplifier 7 are enabled. At that time, the transistor Q9 remains on and the transistor Q10 remains off, since the reference voltage at the node A is set at high enough voltage compared with the voltage charged to the capacitance C1 for reference voltage.

The capacitance C1 for reference voltage is disposed primarily to apply the bias voltage to the first operational amplifier 4 and the second operational amplifier 7. In the circuit shown in FIG. 1, the capacitance C1 for reference voltage is also used to generate a predetermined duration (to keep the operational amplifiers disabled and the buffers enabled). The dual-purpose use of the capacitance C1 eliminates the need for an additional capacitance for setting the duration, and reduces the number of elements, benefiting implementation of the circuit in an IC.

When the power supply is turned on, the shock sound does not occur because the first buffer 13 and second buffer 14 are enabled and the first operational amplifier 4 and the second operational amplifier 7 are disabled, as described above.

Next, turning off of the power supply is explained. When the power supply voltage falls to 0V, an abnormal waveform is applied to the terminal 2. The abnormal waveform goes through the first operational amplifier 4 and the second operational amplifier 7 to the speaker where a shock sound occurs according to the abnormal waveform. Thus in the circuit shown in FIG. 1, utilizing the system to prevent the shock sound at the turning-on of the power supply, the first buffer 13 and the second buffer 14 are used to prevent the shock sound also when the power supply is turned off.

Now the voltage at the power supply line 25 in FIG. 1 is assumed to be switched from Vcc to the ground. Then the voltages at the node A and at the node B fall immediately to the ground. When the voltage at the node A falls to the ground, the transistor Q9 is turned off and the transistor Q10 is turned on. The voltage at the terminal 26 is lowered gradually at low rate, since the capacitance C1 for reference voltage is discharged through the resistance R2.

When the transistor Q10 is turned on, the transistor Q8 is turned on and the control circuit 19 turns the switch 20 to the terminal a. Voltages at the terminal 9 and at the terminal 10 are determined by a DC voltage of the buffer 12. Therefore, the voltages at the terminal 9 and at the terminal 10 are not affected even the abnormal waveform is applied from the terminal 2.

When the voltage at the node B falls to the ground, the transistor Q4 is turned off and the transistor Q5 is turned on. When the transistor Q4 is turned off, the transistor Q3 is turned off and the current mirror circuit 17 stops charging.

As a result, the shock sound at turning-off of the power supply also can be prevented according to the circuit shown in FIG. 1.

Figure 3:
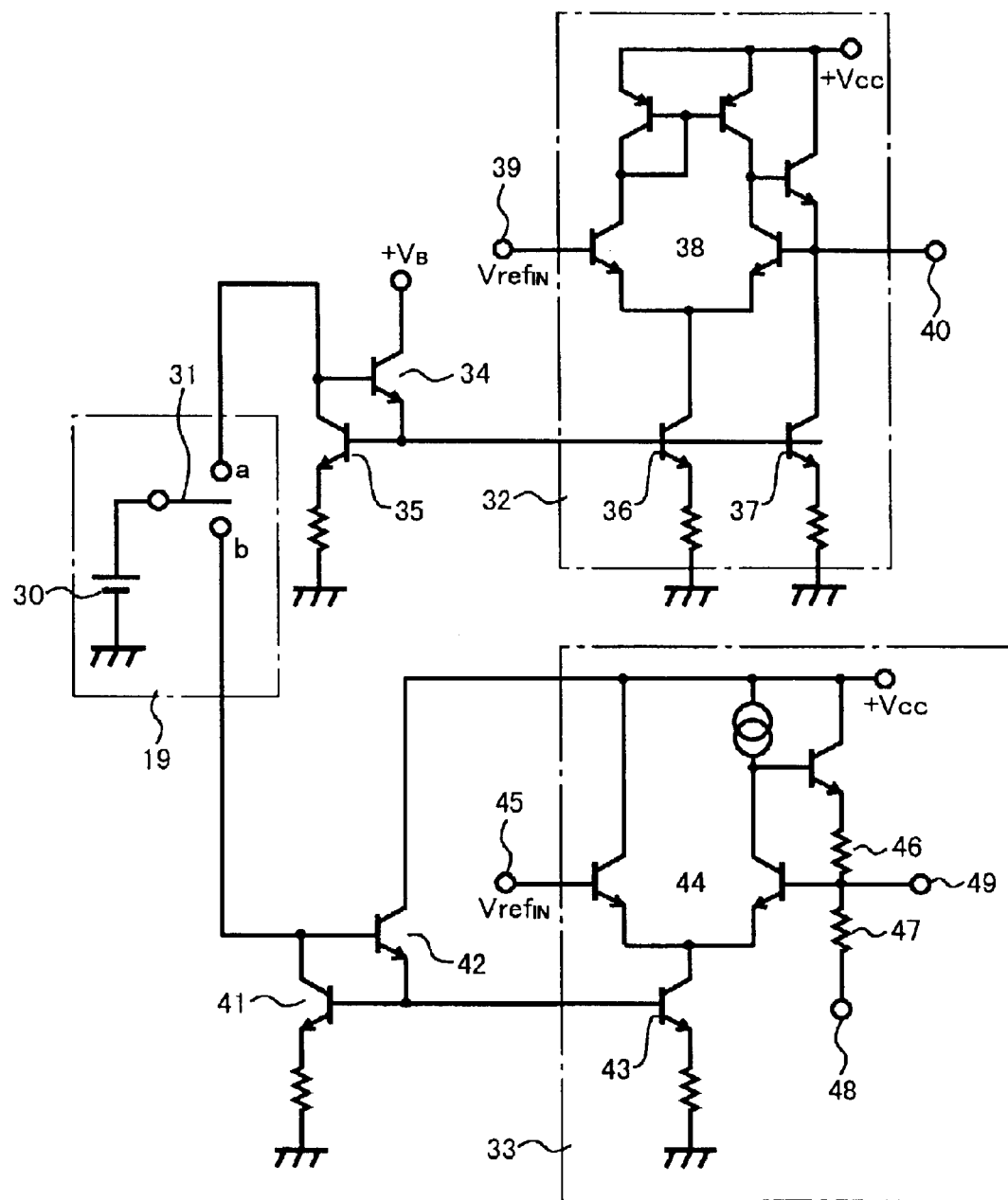
FIG. 3 is a concrete circuit diagram showing a buffer, an operational amplifier and a control circuit according to the embodiment of this invention.

An example of a concrete circuit for a case in which the first buffer 13, the second buffer 14, the first operational amplifier 4 and the second operational amplifier 7 in FIG. 1 are driven by the control circuit 19 is shown in FIG. 3.

The control circuit 109 in FIG. 3 includes a voltage source 30 and a switch 31, which flips to a-side when the buffer 32 is to be enabled and flips to b-side when the operational amplifier 33 is to be enabled. When the switch 31 flips to a-side, a voltage from the voltage source 30 is applied to transistors 34 and 35 to turn them on. When the transistors 34 and 35 are turned on, transistors 36 and 37 are turned on to put a differential amplifier 38 in operation.

The reference voltage VrefIN from the buffer 12 in FIG. 1 is applied to an input terminal 39 of the differential amplifier 38. Since the differential amplifier 38 makes 100% negative feedback operation, the same voltage as the voltage at the input terminal 39 is obtained at an output terminal 40. Meantime, the operational amplifier 33 halts its operation since transistors 41 and 42 to supply an operating current are turned off.

When the switch 31 flips to b-side, the voltage from the voltage source 30 is applied to transistors 41 and 42 to turn them on. When the transistors 41 and 42 are turned on, a transistor 43 is turned on to put a differential amplifier 44 in operation. The reference voltage VrefIN from the buffer 12 in FIG. 1 is applied to an input terminal 45 of the differential amplifier 44. The differential amplifier 44 makes amplification with a gain defined by a ratio between resistances 46 and 47. A signal from an input terminal 48 is amplified and led out to an output terminal 49.

As described above, the buffer and the operational amplifier can be alternatively put in operation, according to the circuit in FIG. 3.

According to this invention, there arises no shock sound, since the first and the second buffers are turned on while the first and the second operational amplifiers are turned off immediately after turning-on of the power supply and the voltage charged to the capacitance for reference voltage is applied to the first and the second buffers to make the voltages at both ends of the speaker equal.

Also according to this invention, no shock sound comes out from the speaker at the time when the operation is switched from the buffers to the operational amplifiers, since the first and the second buffers are turned on immediately after turning-on of the power supply to charge the blocking capacitor in advance and then later the first and the second operational amplifiers are turned on, making the voltages at the both ends of the speaker equal at the time of the switch over.

What is claimed is:
1. A shock sound prevention circuit comprising:
 a terminal for reference voltage, a reference voltage at which rises according to turning-on of a power supply;
 a first operational amplifier to which an audio signal input and the reference voltage are applied;

a second operational amplifier to which a reverse signal of the audio signal input and the reference voltage are applied;

a first buffer to which the reference voltage is applied;

a second buffer to which the reference voltage is applied; and a control circuit which turns on the first buffer and the second buffer while turns off the first operational amplifier and the second operational amplifier immediately after a turning-on of the power supply.

2. The shock sound prevention circuit of the claim 1, wherein the control circuit turns off the first buffer and the second buffer while turns on the first operational amplifier and the second operational amplifier at a predetermined time after turning-on of the power supply.

3. A shock sound prevention circuit comprising:

an input terminal to which an audio signal, from which DC component is removed, is applied;

a terminal for reference voltage, a reference voltage at which rises according to turning-on of a power supply;

a first operational amplifier to which the reference voltage from the terminal for reference voltage is applied as a bias voltage and amplifies the audio signal from the input terminal;

a second operational amplifier to which the reference voltage from the terminal for reference voltage is applied as a bias voltage and amplifies a reverse signal of the audio signal applied to the first operational amplifier;

a first buffer to which the reference voltage from the terminal for reference voltage is applied;

a second buffer to which the reference voltage from the terminal for reference voltage is applied;

a first output terminal to which an output of the first operational amplifier and an output of the first buffer are connected together;

a second output terminal to which an output of the second operational amplifier and an output of the second buffer are connected together; and a control circuit which turns on the first buffer and the second buffer while turns off the first operational amplifier and the second operational amplifier immediately after a turning-on of the power supply, wherein DC voltages at the first output terminal and at the second output terminal are varied identically with each other accordingly as the reference voltage varies.

4. The shock sound prevention circuit of the claim 3, wherein the control circuit turns off the first buffer and the second buffer while turns on the first operational amplifier and the second operational amplifier at a predetermined time after turning-on of the power supply to obtain an amplified audio signal between the first output terminal and the second output terminal.

5. The shock sound prevention circuit of the claim 3, further comprising a speaker is connected between the first output terminal and the second output terminal.

6. A shock sound prevention circuit comprising:

a blocking capacitor to remove DC component in an audio signal input;

a capacitance for reference voltage which is charged upon turning-on of a power supply and generates a reference voltage;

a first operational amplifier to which the reference voltage from the capacitance for reference voltage is applied as a bias voltage and amplifies an audio signal from the blocking capacitor;

a second operational amplifier to which the reference voltage from the capacitance for reference voltage is applied as a bias voltage and amplifies a reverse signal of the audio signal applied to the first operational amplifier;

a first buffer to which the reference voltage from the capacitance for reference voltage is applied;

a second buffer to which the reference voltage from the capacitance for reference voltage is applied;

a first output terminal to which an output of the first operational amplifier and an output of the first buffer are connected together;

a second output terminal to which an output of the second operational amplifier and an output of the second buffer are connected together; and a speaker connected between the first output terminal and the second output terminal; and a control circuit which turns on the first buffer and the second buffer while turns off the first operational amplifier and the second operational amplifier immediately after a turning-on of the power supply.

7. The shock sound prevention circuit of the claim 6, wherein the control circuit turns off the first buffer and the second buffer while turns on the first operational amplifier and the second operational amplifier at a predetermined time after turning-on of the power supply to obtain an amplified audio signal between the first output terminal and the second output terminal.

8. The shock sound prevention circuit of the claim 6, wherein the first buffer and the second buffer charge the blocking capacitor immediately after a turning-on of the power supply.

9. The shock sound prevention circuit of the claim 6, wherein the first operational amplifier, the second operational amplifier, the first buffer and the second buffer are disposed inside an integrated circuit, while the blocking capacitor and the capacitance for reference voltage are disposed outside the integrated circuit.

* * * * *